(12) United States Patent
Modaffari et al.

(10) Patent No.: US 11,984,860 B2
(45) Date of Patent: May 14, 2024

(54) CHARGE AMPLIFICATION CIRCUITS AND METHODS

(71) Applicant: STMicroelectronics S.r.l., Agrate Brianza (IT)

(72) Inventors: Roberto Modaffari, Pallanzeno (IT); Paolo Pesenti, Senago (IT); Mario Maiore, Aci Sant'Antonio (IT); Tiziano Chiarillo, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 56 days.

(21) Appl. No.: 17/839,335

(22) Filed: Jun. 13, 2022

(65) Prior Publication Data

US 2022/0416743 A1 Dec. 29, 2022

(30) Foreign Application Priority Data

Jun. 23, 2021 (IT) .................. 102021000016439

(51) Int. Cl.
*H03F 3/70* (2006.01)
*G01R 27/26* (2006.01)
*H03F 3/45* (2006.01)

(52) U.S. Cl.
CPC ........... *H03F 3/70* (2013.01); *G01R 27/2605* (2013.01); *H03F 3/45968* (2013.01); *H03F 2200/375* (2013.01)

(58) Field of Classification Search
CPC ................ H03F 3/70; H03F 2200/375; H03F 2203/45526; H03F 3/45475; H03F 3/45968; G01R 27/2605
See application file for complete search history.

(56) References Cited

U.S. PATENT DOCUMENTS 9,461,625 B1 * 10/2016 Prandi .................. H03H 19/004
2007/0152682 A1 7/2007 Ungaretti et al.
2017/0187335 A1 6/2017 Nicollini et al.

* cited by examiner

*Primary Examiner* — Amy He
(74) *Attorney, Agent, or Firm* — Seed IP Law Group LLP (57) ABSTRACT

A circuit includes an amplifier, a bias voltage node, and a first set of switches configured, based on a first reset signal having a first value, to couple first and second input nodes to the bias voltage node and to couple first and second output nodes of the amplifier. First and second feedback branches each include a respective RC network including a plurality of capacitances. The first and second feedback branches further include a second set of switches intermediate input nodes and the capacitances, and a third set of switches intermediate input nodes and the plurality of capacitances. These switches selectively couple the capacitances to the input nodes and output nodes, based on a second reset signal having a first value. The second reset signal keeps the first value for a determined time interval exceeding a time interval in which the first reset signal has the first value.

20 Claims, 7 Drawing Sheets

CHARGE AMPLIFICATION CIRCUITS AND METHODS

BACKGROUND

Technical Field

The description relates to charge amplifier circuits and methods thereof.

One or more embodiments may be applied to capacitive sensors, such as pressure sensors, for instance.

Description of the Related Art

Charge amplifier circuits are suitable for a variety of electronic applications. For instance, they can be employed in readout chains of capacitive micro-electromechanical systems, MEMS, sensors (that is, sensors configured to transduce a variation of a given physical quantity into a capacitive displacement).

In this context, the charge amplifier is used to convert the variation of charge stored in capacitive elements in a voltage signal, facilitating processing of the signal by further signal processing chains. For instance, in case of a digital signal processing chain, the charge amplifier is coupled to an analog-to-digital converter (briefly, ADC) configured to provide a digital representation of the input voltage signal, optionally applying anti-aliasing filtering.

Existing charge amplifier arrangements may suffer from one or more of the following drawbacks:
- presence of an offset error leading to a deterioration of the accuracy,
- growth of the detrimental effect of the offset error based on a reduction of the capacitance used in the feedback branch of the amplifier,
- growth of the detrimental effect of the offset error based on an increase of the gain from the offset source.

BRIEF SUMMARY

One or more embodiments of the present disclosure contribute in overcoming the aforementioned drawbacks.

According to one or more embodiments, technical benefits can be achieved by a charge amplifier circuit having the features set forth and described herein.

One or more embodiments may relate to a corresponding capacitive sensor (e.g., pressure sensor).

One or more embodiments may relate to a corresponding method of operating the circuit/device.

One or more embodiments may reduce power consumption, facilitating integrating the charge amplifier in low power application contexts.

One or more embodiments may facilitate compensating, up to eliminating, offset errors in the output voltage signal produced by the charge amplifier circuit.

In one or more embodiments, offset is cancelled in an improved way, e.g., faster.

BRIEF DESCRIPTION OF THE SEVERAL VIEWS OF THE DRAWINGS

One or more embodiments will now be described, by way of non-limiting example only, with reference to the annexed Figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

For the sake of simplicity, in the following detailed description a same reference symbol may be used to designate both a node/line in a circuit and a signal which may occur at that node or line.

Figure 1:
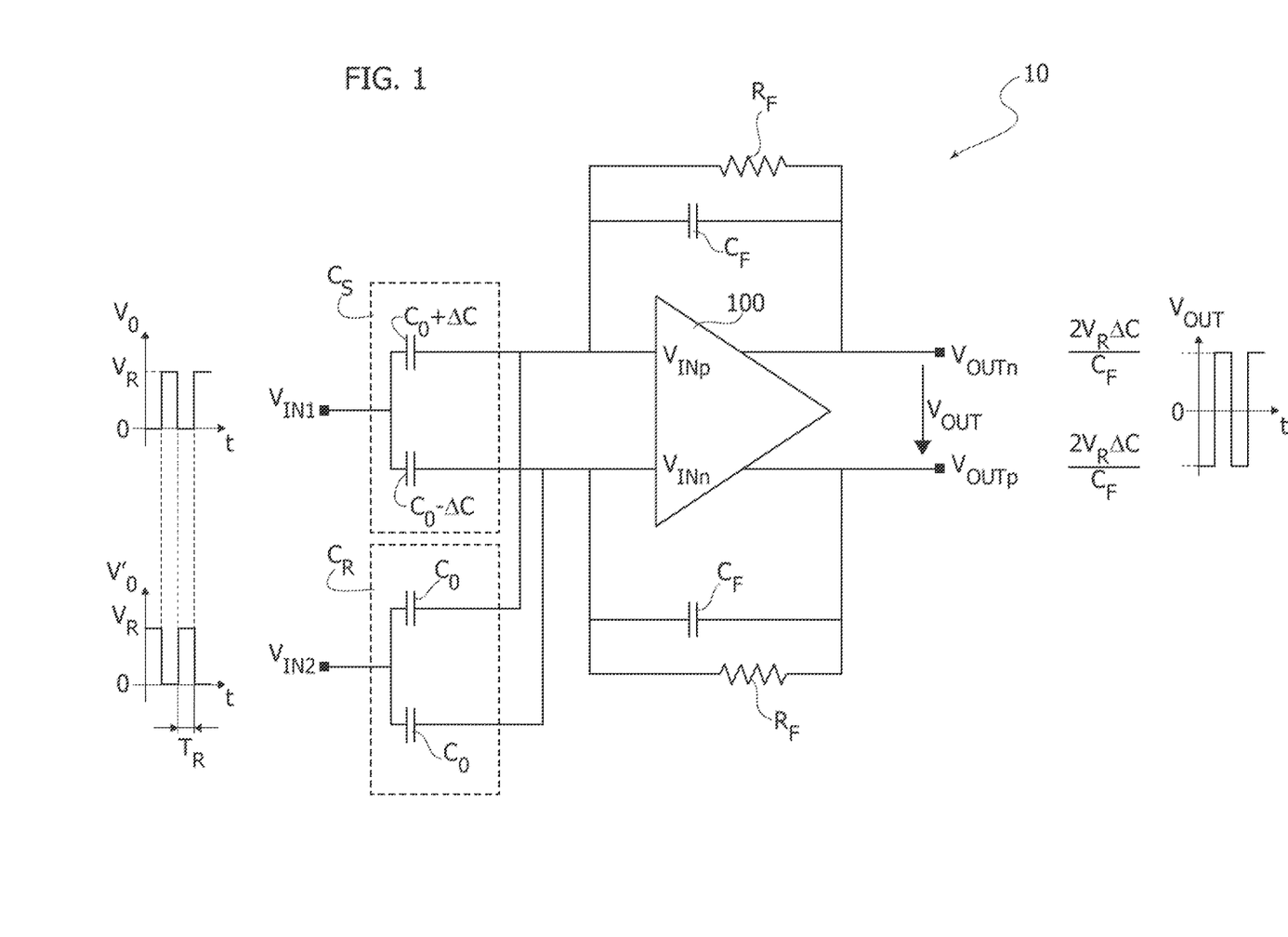
FIGS. 1 and 2 are exemplary diagrams of a charge amplifier.

As exemplified in FIG. 1, a (e.g., continuous-time) charge amplifier circuit 10 comprises:
- a capacitive sensor $C_S$ (e.g., a MEMS sensor) for instance comprises a pair of (e.g., parallel) sensing capacitances $C_0$, the sensor $C_S$ having a first input node $V_{IN1}$ configured to transduce a variation of a physical quantity (for instance, acceleration, position or pressure) into a capacitive displacement $\pm \Delta C$ in response to a first voltage signal $V_0$ (e.g., a square waveform with amplitude $V_R$ and frequency $F_R = 1/T_R$) applied to the first input node $V_{IN1}$,
- an operational transconductance amplifier (OTA) 100, having:
  - a first (e.g., non-inverting) input node $V_{INp}$ (e.g., directly) coupled to the sensor $C_S$ and to a first output node $V_{OUTn}$ of the OTA 100 via a first feedback branch comprising a first RC network $R_F$, $C_F$, and
  - a second (e.g., inverting) input node $V_{INn}$ (e.g., directly) coupled to the sensor $C_S$ and to a second output node $V_{OUTp}$ via a second feedback branch comprising a second RC network, for instance equal to the first RC network $R_F$, $C_F$.

As mentioned, existing charge amplifier can present an offset error whose recovery time can exceed design constraints. This is due to a large time-constant defined from the big feedback resistance used to bias the virtual ground of this kind of circuits.

Reducing a start-up time in sensor interfaces is particularly relevant in cases where there is a cyclic transition from "normal" operating mode to the "power down" mode, and vice versa. Such a so-called "low power mode" is relevant for applications where power consumption is to be reduced, such as mobile devices having battery life constraints, for instance.

As exemplified in FIG. 1, the charge amplifier 10 is configured to sense a differential charge injected towards its virtual grounds. For instance, in the exemplary case of FIG. 1, the differential charge has a value $2V_R \Delta C$. For instance, it is integrated on feedback capacitance of the stage $C_F$, generating a differential output voltage signal $V_{OUT}$ (e.g., also having a square waveform) which can be expressed as:

$$V_{OUT} = V_{OUTp} - V_{OUTn} = 2V_R \cdot \frac{\Delta C}{C_F}$$

As exemplified in FIG. 1, the amplifier circuit 10 comprises a reference branch, referred to as "dummy" capacitance $C_R$. For instance, the dummy capacitance $C_R$ comprises a replica of the sensing capacitance $C_0$ at rest (that is, without any signal applied thereto), and has respective input node $V_{IN2}$ configured to receive a second "test" voltage signal $V_0'$, for instance, in quadrature with the first voltage signal $V_0$ so that $V_0'$=not($V_0$).

For instance, the capacitive displacement $\Delta C$ represents the "sensitivity" of the sensing capacitance $C_S$ in response to an external variation of the physical quantity to measure. Such a capacitive variation $\Delta C$ associated to the full-scale measurement spaces from 1 fF (1 fF=1 femtoFarad=$10^{-15}$ Farad) to few tens of fF, for instance.

Taking into account the expression of the differential output voltage signal $V_{OUT}$ discussed in the foregoing and the reduced sensitivity $\Delta C$, relevant in particular for certain kind of capacitive sensors such as MEMS sensors, for instance, it turns out that a high input voltage amplitude $V_R$ and small feedback capacitance $C_F$ facilitate providing an adequate amplification factor. For instance, an adequate amplification factor refers to a value of gain that properly addresses the performances involved in the whole readout chain.

In order to desirably limit a total power consumption of the whole system, the value of the input voltage $V_R$ may be constrained below power supply level. This leads to the feedback capacitance of the amplifier $C_F$ remaining as the main design knob available to increase the gain of the stage.

As exemplified in FIG. 1, the resistance $R_F$ in the feedback branches $R_F$, $C_F$ of the OTA 100 is exploited to set the input common mode $V_{CM}$ of the OTA 100. In the example considered, the feedback resistance $R_F$ can be sized so as to render negligible both the discharge of the feedback capacitances $C_F$ in a half-period interval $T_R/2$ and the associated thermal noise contribution at the signal frequency $F_R$. To this end Considering the order of magnitude of the capacitances involved, it turns out that the feedback resistances $R_F$ can must be selected to be of the order of G$\Omega$(1 G$\Omega$=1 gigaOhm=$10^9\Omega$), thus having to a negligible thermal noise negligible at signal frequency $F_R$.

Figure 2:
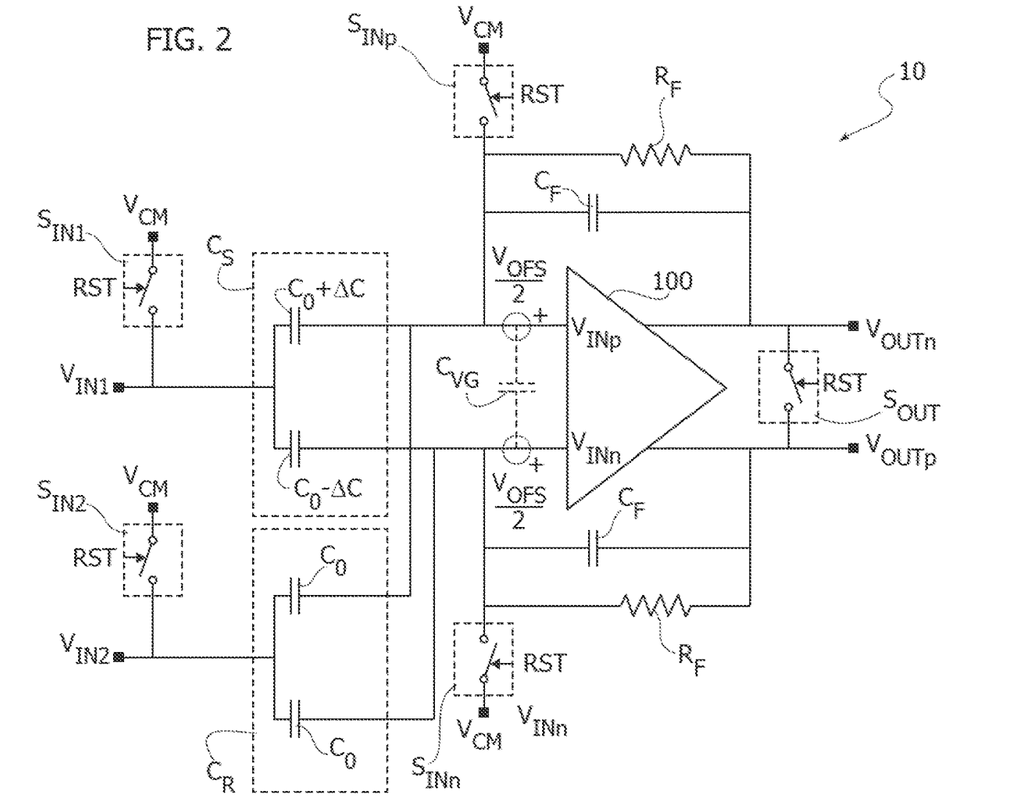

As exemplified in FIG. 2, the charge amplifier circuit 10 may further comprise:
  a common mode node $V_{CM}$ configured to receive a common mode voltage level $V_{CM}$, and
  a set of reset switches $S_{IN1}$, $S_{IN2}$, $S_{INp}$, $S_{INn}$, $S_{OUT}$ comprising:
    a first reset switch $S_{IN1}$ configured to selectively couple the common mode $V_{CM}$ to the first input node $V_{IN1}$,
    a second reset switch $S_{IN2}$ configured to selectively couple the common mode $V_{CM}$ to the second input node $V_{IN2}$,
    a third reset switch $S_{INp}$ configured to selectively couple the common mode $V_{CM}$ to the first $V_{INp}$ input node of the OTA 100,
    a fourth reset switch $S_{INn}$ configured to selectively couple the common mode $V_{CM}$ to the second $V_{INn}$ input node of the OTA 100,
    a fifth reset switch $S_{OUT}$ configured to selectively couple the output nodes of the OTA 100 therebetween.

As exemplified in FIG. 2, reset switches $S_{IN1}$, $S_{IN2}$, $S_{INp}$, $S_{INn}$, $S_{OUT}$ are driven via a reset signal RST. For instance, the switches $S_{IN1}$, $S_{IN2}$, $S_{INp}$, $S_{INn}$, $S_{OUT}$ are configured to be in a first (e.g., closed) state when the reset signal RST has a first value (e.g., "1") and in a second (e.g., open) state when the signal RST has a second value (e.g., "0").

As exemplified in FIG. 2:
  the third and fourth switches $S_{INp}$, $S_{INn}$ are configured to "short (circuit)" input nodes $V_{INp}$, $V_{INn}$ of the OTA 100 to the common mode voltage $V_{CM}$,
  the fifth switch $SW_{OUT}$ is configured to short the output nodes of the OTA together,
  consequently, the first and second switches $S_{IN1}$, $S_{IN2}$ are configured to reset sensor and dummy capacitances $C_S$, $C_R$.

An arrangement as exemplified in FIG. 2 may present the drawback that a fast start-up may hardly be feasible as hardly any charge stored in the circuit 10 can reach a desired common-mode bias point $V_{CM}$ suitable for such a fast start-up, for instance.

Figure 3:
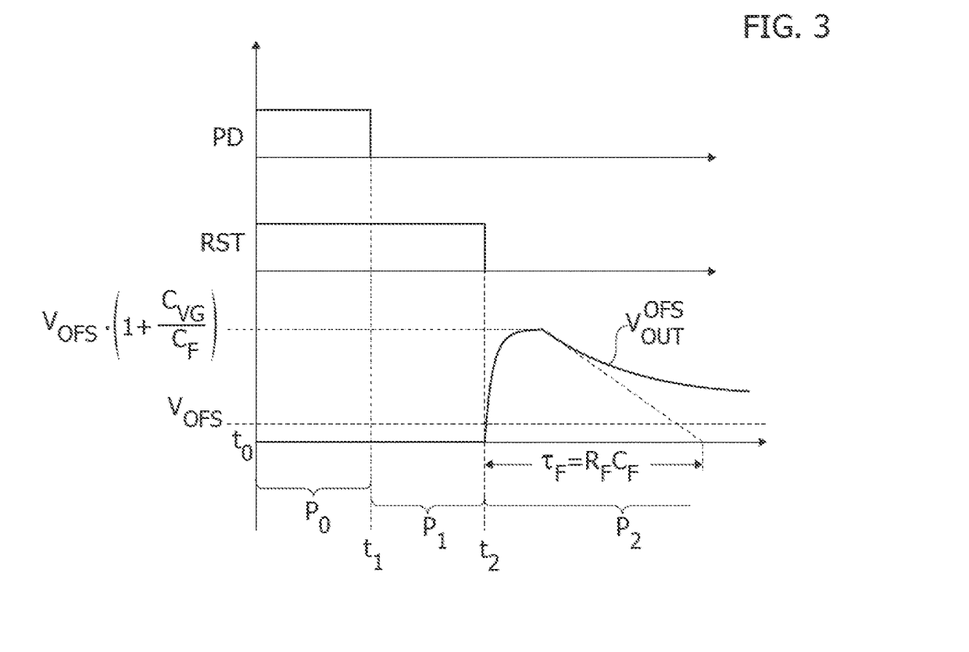
FIG. 3 is an exemplary time-diagram of signals in operating the charge amplifier of FIG. 2.

FIG. 3 is a diagram exemplary of signals involved in a start-up phase of the circuit of FIG. 2.

As exemplified in FIG. 3, for instance:
  at an initial time $t_0$, a power-down signal PD is set to a first value (e.g., "1"), initiating a portion $P_0$ of the start-up phase; for instance, during portion $P_0$, the circuit 10 is in power-down (e.g., turned "off" state);
  at time $t_1$, in a second portion $P_1$, the power-down signal is set to a second value (e.g., "0") and the reset signal RST is set at a first value (e.g., "1"); in other words, after the power-down, the power-on is initiated and the circuit 10 is reset during a phase portion $P_1$; in particular, the sensor capacitance $C_S$ of the sensor and the input nodes of the OTA are coupled to $V_{CM}$ via the switches $SW_{RST}$, while the outputs of the amplifier are coupled therebetween;
  at time $t_2$, in a third portion $P_2$, the reset signal RST is set at a second value (e.g., "0") and capacitances of the sensor $C_S$ and the dummy $C_R$ are coupled to the respective drive signals $V_0$, $V_0'$ and an offset level \Tops at the input nodes varies based on a total capacitance $C_{VG}$ of the virtual ground (represented in dashed lines in FIG. 2) at input nodes $V_{INp}$, $V_{INn}$ of the OTA 100.

For instance, total capacitance $C_{VG}$ may be expressed as:

$$C_{VG}=2C_0+C_G+C_{PAR}$$

where:
- $C_0$ is a value of the sensing capacitance of the sensing branches of the sensor $C_S$ and of the dummy capacitance $C_R$,
- $C_G$ is the input capacitance of the OTA 100, and
- $C_{PAR}$ is a parasitic capacitance, e.g., of the sensor together with the routing. In one or more embodiments, the sensing capacitance $C_0$ may have values in a range 100 fF–1 pF (1 pF=1 picoFarad=$10^{-12}$ Farad), based on sensor (manufacturing) technology process.

In one or more embodiments, the (gate) capacitance $C_G$ of the OTA 100 may have values about hundreds of fF, in particular for a low noise OTA with low flicker and high input transconductance, for instance.

In one or more embodiments, the parasitic capacitance $C_{PAR}$ may have values in the range about 100 fF–1 pf, in particular as it takes into account the contribution of parasitic capacitance from the sensor (e.g., in the pF scale) and of the routing (e.g., hundreds of fF).

It may be possible to express the total offset charge $Q_{OFS}$ transferred on the feedback capacitance $C_F$ as:

$$Q_{OFS} = V_{OFS} \cdot C_{VG}$$

As a result, the output signal in phase $P_2$, as exemplified in FIG. 3, can be expressed as:

$$V_{OUT}^{OFS} = V_{OFS} \cdot \left(1 + \frac{C_{VG}}{C_F}\right)$$

As exemplified in FIG. 3, at the beginning of portion $P_2$, after time $t_2$, there is a quick injection of offset charge $Q_{OFS}$ in the feedback capacitances $C_F$ as soon as the reset signal RST goes to the second value. As soon as the output signal value $V_{OUT}^{OFS}$ is reached, the circuit evolution towards a steady-state condition with output signal equal to offset voltage $V_{OFS}$, that is $V_{OUT}=V_{OFS}$. For instance, reaching this steady-state condition involves discharging feedback capacitances $C_F$ via the feedback resistances $R_F$, the discharging taking place with a time constant $\tau_F = R_F C_F$.

As exemplified in FIG. 3, this time constant may produce a relatively slow falling trend for the output voltage $V_{OUT}$ (with respect to the rising trend of the output voltage).

As exemplified in FIG. 3, with respect to an "ideal" steady state evolution (represented in dashed line), the steady state condition which may be reached in the circuit of FIG. 2 presents an offset error in the output value $V^{OFS}_{OUT}$. This may be due, for instance, to an offset factor equal to a ratio $C_{VG}/C_F$ of the total capacitance $C_{VG}$ over the feedback capacitance. For instance, the ratio is in a range of values 10 to 50, based on the sensor technology used as well as on the sizing of the feedback capacitance $C_F$ of the amplifier, as discussed in the foregoing. As a result of this start-up, the output signal may take a relatively long time $t_0$ go back to the steady-state offset value $V_{OFS}$ from peak value $V_{OUT}^{OFS}$.

Figure 4:
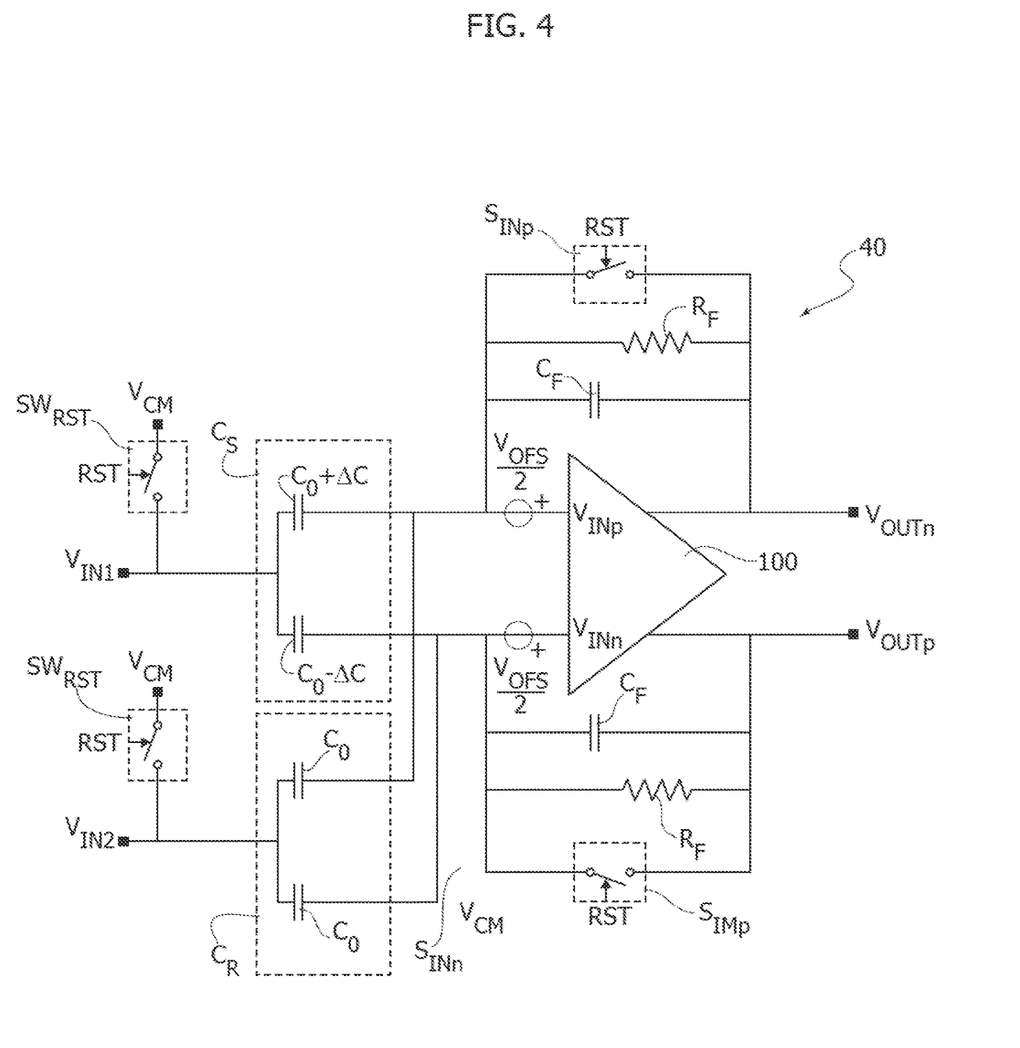
FIG. 4 is an exemplary circuit diagram of an alternative charge amplifier.

A possible approach to tackle the offset issue is illustrated in FIG. 4.

As exemplified in FIG. 4, third and fourth reset switches $S_{INp}$, $S_{INn}$ are coupled across input and output nodes of the amplifier 100 in place of the common mode voltage $V_{CM}$ (as exemplified in FIG. 2). In this way, for instance, during reset phase (e.g., RST="1") the offset is stored on the total capacitance $C_{VG}$, but no charge is transferred to the feedback capacitance $C_F$. As a result, once reset is released (e.g., RST="0") the circuit 40 has already applied the offset voltage at its output nodes, speeding up startup.

A solution as exemplified in FIG. 4 may still present some drawbacks and limited applicability in low-power applications. For instance, the ratio $C_{VG}/C_F$ among capacitances $C_{VG}$ and $C_F$ is a relevant parameter for both offset amplification factor and feedback gain attenuation.

For instance, the feedback gain attenuation has a positive impact on the stability of the circuit, reducing a Gain-BandWidth Product (briefly, GBWP) of the closed-loop amplifier by an amount equal to the ratio $C_{VG}/C_F$. For instance, this facilitates reducing current consumption of an output stage where a multi-stage OTA is used.

In existing solutions, a buffer configuration of the OTA may be used in order to cancel the offset-related error. In this case, there are no capacitive partitions and consequently no positive impact on the GBWP. This can lead to an increased risk of instability. To counter this increased instability, existing solutions envisage increasing current consumption. These solutions are hardly compatible with low power applications.

A solution as discussed herein facilitates offset cancellation while involving a reduced effort with respect to that associated to the stabilization of the OTA 100 at its GBWP frequency, consequently countering the otherwise involved increase of current consumption.

In one or more embodiments, introducing a delayed reset phase may facilitate overcoming aforementioned limitations in terms of stability and power consumption.

Figure 5:
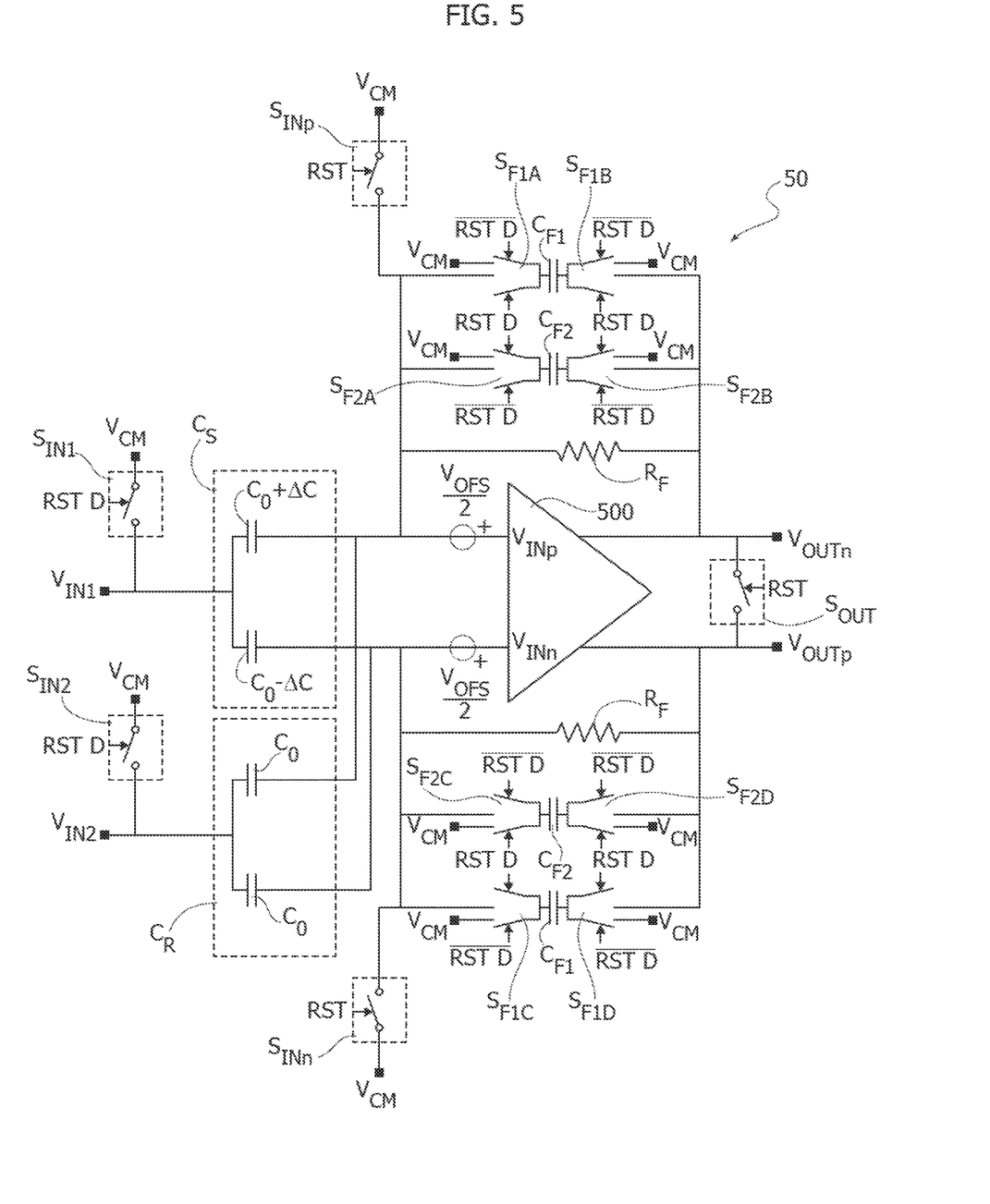
FIG. 5 is a circuit diagram exemplary of a charge amplifier circuit as per the present disclosure.

As exemplified in FIG. 5, the charge amplifier circuit 50 comprises an operational transconductance amplifier (OTA) 500 including:

- a first (e.g., non-inverting) input node $V_{INp}$ (e.g., directly) configured to be coupled to the capacitive sensor $C_S$ and to a first output node $V_{OUTn}$ of the OTA 100 via a first feedback branch comprising a first RC network $R_F$, $C_{F1}$, $C_{F2}$, including at least a first capacitance $C_{F1}$ and a second capacitance $C_{F2}$, e.g., in parallel therebetween, and
- a second (e.g., inverting) input node $V_{INn}$ (e.g., directly) coupled to the capacitive sensor $C_S$ and to a second output node $V_{OUTp}$ via a second feedback branch comprising a second RC network, for instance equal to the first RC network $R_F$, $C_{F1}$, $C_{F2}$,
- a common mode node $V_{CM}$ configured to receive a common mode voltage level $V_{CM}$,
- a first set of reset switches $S_{IN1}$, $S_{IN2}$, $S_{INp}$, $S_{INn}$, $S_{OUT}$ configured to be driven by a first reset signal RST, the first set of reset switches $S_{IN1}$, $S_{IN2}$, $S_{INp}$, $S_{INn}$, $S_{OUT}$ arranged and configured to operate along the lines of like referenced reset switches discussed in the foregoing with respect to FIG. 2,
- a second set of switches $S_{F1A}$, $S_{F1B}$, $S_{F1C}$, $S_{F1D}$, $S_{F2A}$, $S_{F2B}$, $S_{F2C}$, $S_{F2D}$ configured to be driven by a second "delayed" reset signal RSTD, switches in the second set of switches $S_{F1A}$, $S_{F1B}$, $S_{F1C}$, $S_{F1D}$, $S_{F2A}$, $S_{F2B}$, $S_{F2C}$, $S_{F2D}$ being configured to couple capacitances CF1, CF2 in the first and second feedback branches of the OTA 500 to the input $V_{INp}$, $V_{INn}$ and/or output nodes $V_{OUTp}$, $V_{OUTn}$ thereof.

For instance, the feedback capacitances $C_{F1}$, $C_{F2}$ in the feedback branches of the OTA 500 can be equal, e.g., $C_{F1}=C_{F2}=C_F$.

A circuit as exemplified herein, comprises:
- an amplifier (for instance, 500) having a first input node (for instance, $V_{INp}$) and a second input node (for instance, $V_{INn}$ configured to be coupled to opposite ends of at least one capacitance (for instance, $C_S$, $C_D$) to detect therefrom a capacitive variation signal (for instance, $\Delta C$) indicative of variations in the value of the at least one capacitance, the amplifier (e.g., single stage or multi-stage OTA) having a first output node (for instance, $V_{OUTp}$) and a second output node (for instance, $V_{OUTn}$), a bias voltage node (for instance, $V_{CM}$) configured to provide a bias voltage level, a first set of switches (for instance, $S_{INp}$, $S_{INn}$, $S_{OUT}$) configured, based on a first reset signal (for instance, RST) having a first value, to couple the first and second input nodes of the amplifier to the bias voltage node and to couple therebetween the first and second output nodes of the amplifier, a first feedback branch (for instance, $R_F$, $C_{F1}$, $C_{F2}$) comprising a first RC network including a first and a second capacitance (for instance, $C_{F1}$, $C_{F2}$), the first feedback branch coupled between the first output node and the first input node of the amplifier, a second feedback branch (for instance, $R_F$, $C_{F1}$, $C_{F2}$) comprising a second RC network including a third and a fourth capacitance (for instance, $C_{F1}$, $C_{F2}$), the second feedback branch coupled between the second output node and the second input node of the amplifier, the first and second feedback branches further comprising:
  a second set of switches (for instance, SF1A, SF1C, SF2A, SF2C) intermediate the first and second input nodes of the amplifier and the first, second, third and fourth capacitances, and
  a third set of switches (for instance, SF1B, SF1D, SF2B, SF2D) intermediate the first and second output nodes of the amplifier and the first, second, third and fourth capacitances,
  wherein
    the switches in the second set of switches are configured to selectively couple one of the first and second capacitances in the first feedback branch and one of the third and fourth capacitances in the second feedback branch to the first and second input nodes of the amplifier based on a second reset signal (for instance, RSTD) having a first value,
    the switches in the third set of switches are configured to selectively couple said one of the first and second capacitances in the first feedback branch and said one of the third and fourth capacitances in the second feedback branch to the first and second output nodes of the amplifier (500) based on a second reset signal having a first value,
    wherein the first reset signal is configured to have a first value for a first time interval (for instance, P0, P1) and to switch (for instance, $t_2$) from the first value to a second value after the first time interval,
    wherein, in response to the first reset signal switching from the first value to the second value, the second reset signal maintains said first value for a further time interval (for instance, P2, $T_{DELAY}$) exceeding the first time interval during which the first reset signal has the first value.

As exemplified herein, the circuit comprises a power supply of the amplifier, the power supply configured to be powered-down based on a power-down (for instance, PD) signal having a first value, the first time interval in which the first reset signal is configured to have the first value comprises a first sub-interval (for instance, P0) and a second sub-interval (for instance, P1), the power-down signal has a first value during the first sub-interval and a second value during the second sub-interval, the power supply of the amplifier being powered-down during the first sub-interval as a result.

As exemplified herein, the amplifier has a signal amplification bandwidth and wherein the further time interval (for instance, P2, $T_{DELAY}$) exceeding the time interval during which the first reset signal has the first value has a time duration that is a function of the signal amplification bandwidth of the amplifier.

As exemplified herein, the amplifier is a fully differential (e.g., multi stage or single stage) operational trans-conductance amplifier, OTA.

As exemplified herein, the second feedback branch is a replica of the first feedback branch.

For instance:
  the first feedback branch comprises the parallel connection of the first capacitance and the second capacitance, said parallel connection in turn arranged in parallel to a resistance (for instance, $R_F$),
  the second set of switches comprises:
    a first switch (for instance, $S_{F1A}$) interposed between the first input node of the amplifier and the first capacitance (for instance, $C_{F1}$),
    a second switch (for instance, $S_{F2A}$) interposed between the first input node of the amplifier and the second capacitance (for instance, $C_{F2}$),
  the third set of switches comprises:
    a respective first switch (for instance, $S_{F1B}$) interposed the first output node of the amplifier and the first capacitance,
    a respective second switch (for instance, $S_{F2B}$) interposed between the first output node of the amplifier circuit and the second capacitance (for instance, $C_{F2}$).

A sensor device (for instance, 50) as exemplified herein, comprises:
  at least one detecting capacitance (for instance, $C_S$) configured to transduce a variation of a physical quantity into a capacitive variation signal (for instance, $\Delta C$),
  a reference capacitive element (for instance, $C_R$) coupled to the at least one capacitance, the reference capacitive element having a value of capacitance substantially equal to a value of capacitance at rest (for instance, $C_0$) of the at least one capacitance,
  a circuit as per the present disclosure having input nodes (for instance, $V_{INp}$, $V_{INn}$ coupled at ends of the at least one detecting capacitance and at ends of the reference capacitive element,
  control circuitry coupled to the circuit and configured to provide a first reset signal (for instance, RST) and a second reset signal (for instance, RSTD) thereto,
  wherein the first reset signal is configured to have a first value for a first time interval and to switch from the first value to a second value after the first time interval,
  wherein, in response to the first reset signal (RST) switching from the first value to the second value, the second reset signal maintains said first value for a further time interval (for instance, $T_{DELAY}$) exceeding the first time interval (for instance, P0, P1) during which the first reset signal has the first value.

As exemplified herein, the sensor comprises a further set of switches (for instance, $S_{IN1}$, $S_{IN2}$) configured to couple an input node (for instance, $V_{INn}$ of the sensing capacitance and an input node (for instance, $V_{IN2}$) of the reference capacitive element to the bias voltage node based on the second reset signal having a first value.

In one or more embodiments, performing a reset phase of the OTA stage 500 in the circuit 50 comprises:
  in a first reset phase, based on a first reset signal RST, coupling the virtual grounds and the shortcut of the two output nodes, and
  in a second reset phase, based on a second reset signal RSTD, performing further acts as discussed in the following, the second reset phase delayed of a time interval with respect to the first reset phase, the time interval determined based on a bandwidth of the OTA 500.

For instance, the second reset signal RSTD controls the feedback capacitance and input nodes of the OTA circuit 500, as discussed in the following.

Figure 6:
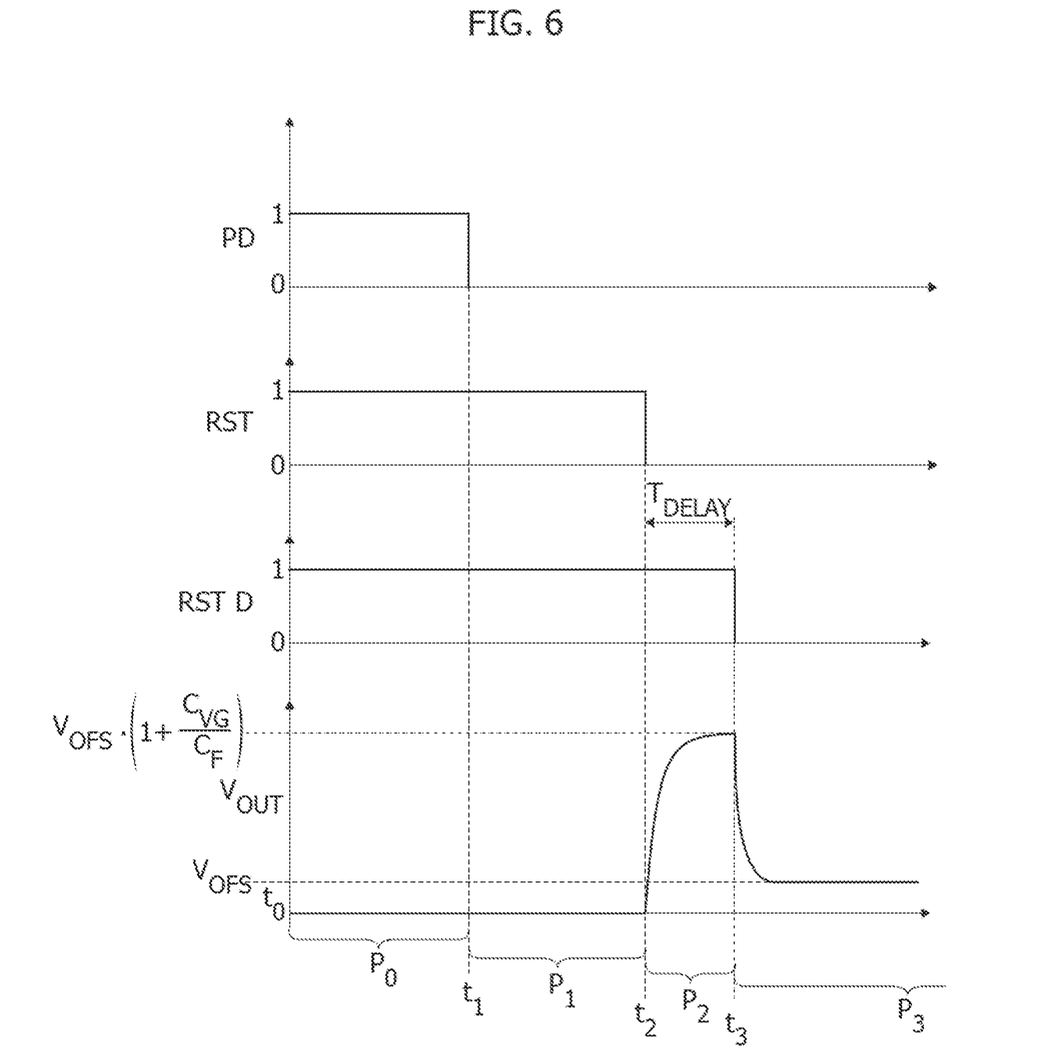
FIG. 6 is a time-diagram exemplary of signals in operating the circuit diagram as per the present disclosure.
Figure 7A:
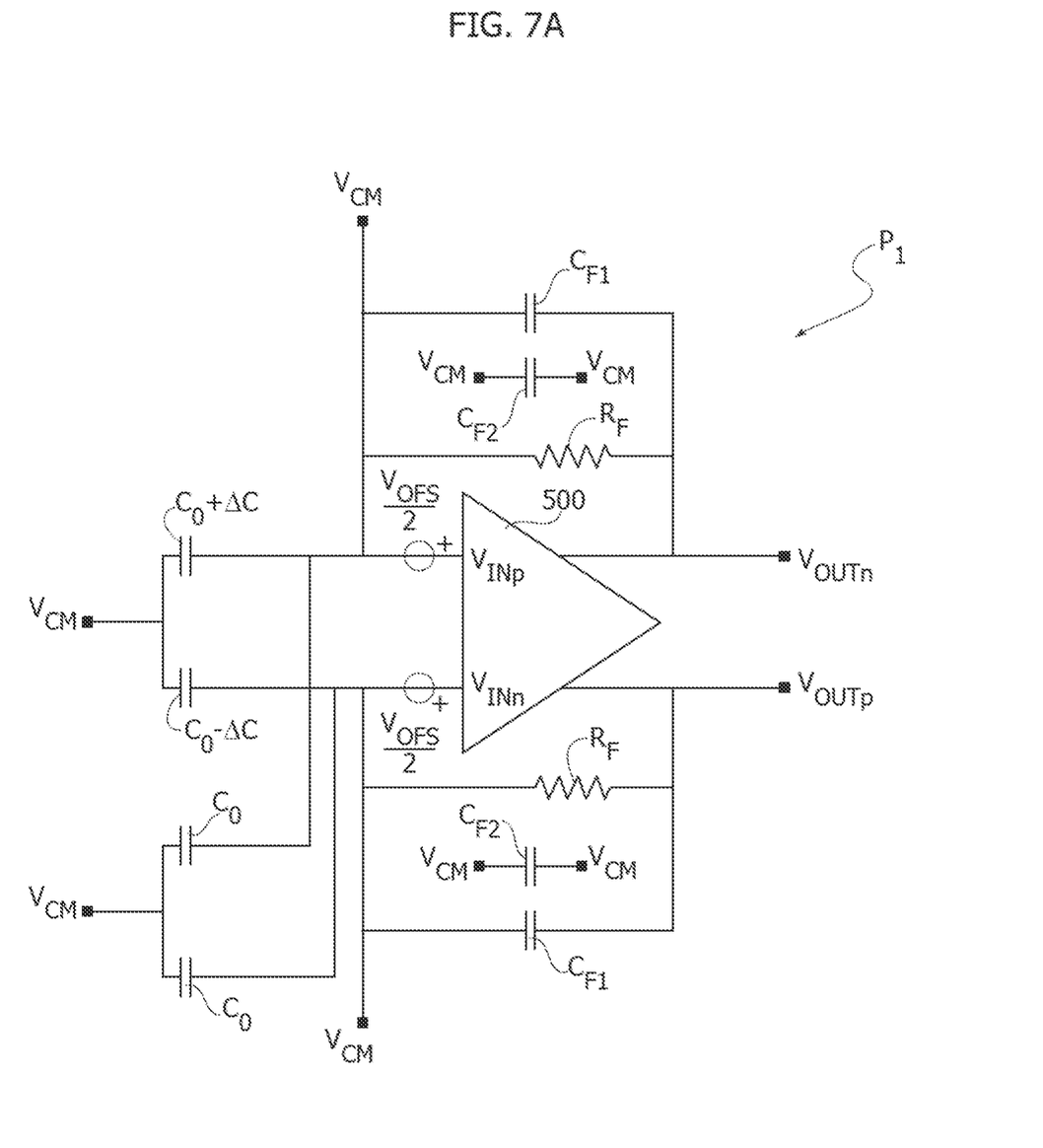
FIGS. 7A, 7B and 7C are circuit diagrams exemplary of operative phases of the circuit represented in FIG. 5.

As exemplified in FIG. 6:
  at initial time $t_0$, during initial phase P0, the circuit 50 is off and stays turned off until the power-down signal PD is at a first signal level (e.g., "1"),
  at time instant $t_1$, ending phase P0 and initiating phase P1, the power-down signal switches to a second signal level (e.g., "0") while the first reset signal RST and the second reset signal RSTD are at the first signal level (e.g., "1"). FIG. 7A is exemplary of the circuit 50 during phase P1. As exemplified in FIG. 7A, switches in the first set of switches $S_{IN1}$, $S_{IN2}$, $S_{INp}$, $S_{INn}$, $S_{OUT}$, and switches in the second set of switches $S_{F1A}$, $S_{F1B}$, $S_{F2A}$, $S_{F2B}$, $S_{F1C}$, $S_{F1D}$, $S_{F2C}$, $S_{F2D}$ are in a first (e.g., "closed") state and couple respective nodes to the common-mode bias voltage level $V_{CM}$, leading to discharge of all the capacitances $C_{F1}$, $C_{F2}$ in the feedback branches of the OTA 500. As a result (see, e.g., FIG. 6), output differential voltage level $V_{OUT}$ during phase P1 is at a ground level.

Figure 7B:
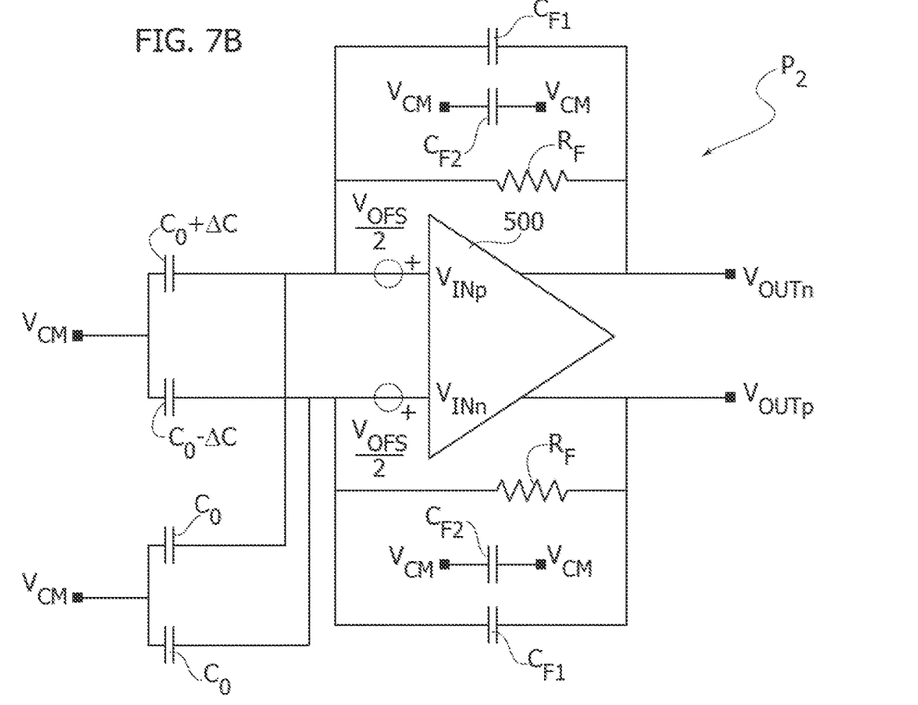

As exemplified in FIG. 6, at time instant $t_2$, ending phase P1 and initiating phase P2, the first reset signal RST switches to the second signal level (e.g., "0") while the second reset switch RSTD remains in the first signal level (e.g., "1"). FIG. 7B is exemplary of the circuit 50 during phase P2. As exemplified in FIG. 7B, the fifth $S_{OUT}$ in the first set of switches $S_{IN1}$, $S_{IN2}$, $S_{INp}$, $S_{INn}$, is released and goes to the second state (e.g., "open") while switches in the second set of switches $S_{F1A}$, $S_{F1B}$, $S_{F2A}$, $S_{F2B}$, $S_{F1C}$, $S_{F1D}$, $S_{F2C}$, $S_{F2D}$ remain in a first (e.g., "closed") state and couple respective nodes to the common-mode bias voltage level $V_{CM}$.

As exemplified in FIGS. 6 and 7B, during phase P2, offset voltage $V_{OFS}$ is transferred to the output nodes $V_{OUTp}$, $V_{OUTn}$ and amplified by amplification factor $(1+C_{VG}/C_F)$, where the charge $V_{OFS}*C_{VG}$ is stored both in the $C_{VG}$ and $C_{F1}$ while the capacitance $C_{F2}$ is shorted to the common bias voltage $V_{CM}$.

As exemplified in FIG. 7B, in order to avoid the cancelation of the signal, input node Vim of the circuit 15 remains coupled to common mode level $V_{CM}$ during phase P2.

Figure 7C:
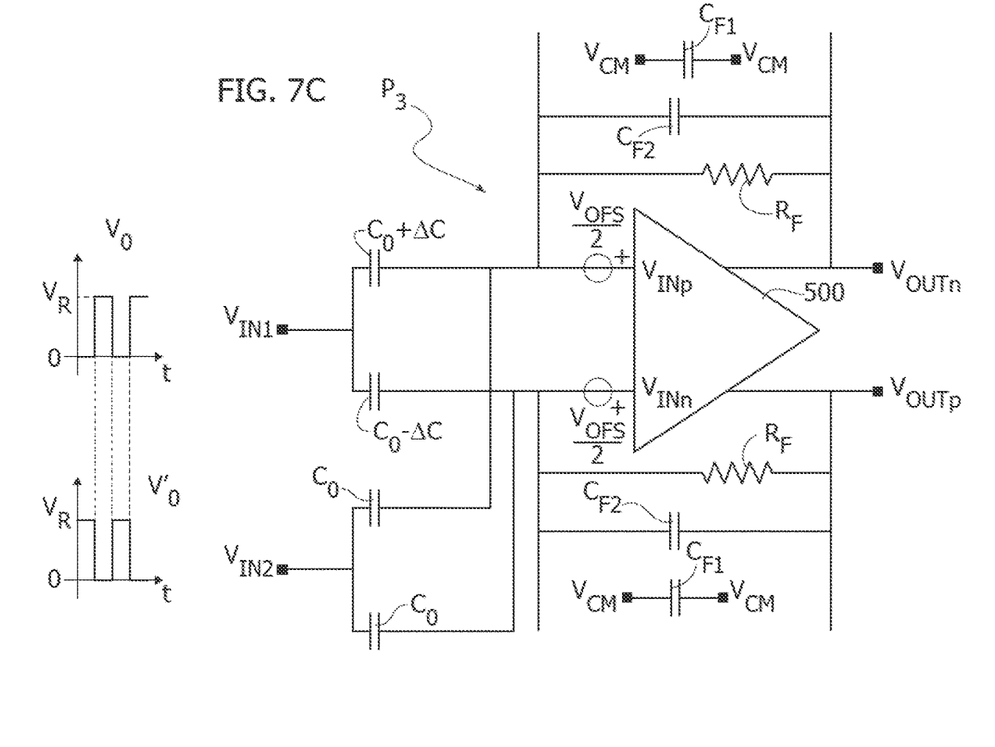

As exemplified in FIG. 6, at time t3, ending phase P2 and initiating phase P3, the second reset switch RSTD switches to a second signal level (e.g., "0"). FIG. 7C is exemplary of the circuit 50 during phase P3. As exemplified in FIG. 7C, based on the second reset signal RSTD, switches in the second set of switches $S_{F1A}$, $S_{F1B}$, $S_{F2A}$, $S_{F2B}$, $S_{F1C}$, $S_{F1D}$, $S_{F2C}$, $S_{F2D}$ are driven so that the first feedback capacitance $C_{F1}$ is decoupled from the OTA 500 and discharged to common move voltage level $V_{CM}$ while the second feedback capacitance $C_{F2}$ starts from a discharged state. As exemplified in FIGS. 6 and 7C, output differential voltage $V_{OUT}$ at the output nodes $V_{OUTn}$, $V_{OUTp}$ of the OTA 500 reach the steady-state voltage value $V_{OFS}$ during phase P3. For instance, a time interval $T_{DELAY}$ between second $t_2$ and third $t_3$ time intervals is equal to the time constant for reaching this steady state condition.

As exemplified in FIG. 6, the time interval $T_{DELAY}$ has a duration determined based on the bandwidth of the amplifier, which is order of magnitude higher than the "slow" time constant of the feedback network $\tau_F = R_F C_F$.

A method of operating a circuit or a sensor device as per the present disclosure, comprises:
  providing a bias voltage node configured to provide a bias voltage level (for instance, $V_{CM}$),
  driving the first set of switches (for instance, $S_{INp}$, $S_{INn}$, $S_{OUT}$), based on a first reset signal (for instance, RST), to couple the input nodes of the amplifier circuit to the bias voltage node ($V_{CM}$) and to couple the first and second output nodes of the amplifier circuit therebetween,
  driving switches in the second set of switches (for instance, $S_{F1A}$, $S_{F1C}$, $S_{F2A}$, $S_{F2C}$) to selectively couple one of the first (for instance, $C_{F1}$) and second (for instance, $C_{F2}$) capacitances in the first feedback branch (for instance, $C_{F1}$, $C_{F2}$, $R_F$) and one of the third (for instance, $C_{F1}$) and fourth (for instance, $C_{F2}$) capacitances in the second feedback branch (for instance, $R_F$, $C_{F1}$, $C_{F2}$) to the first (for instance, $V_{INp}$) and second (for instance, $V_{INn}$ input nodes (for instance, $V_{INn}$, $V_{INp}$ of the amplifier based on a second reset signal (for instance, RSTD) having a first value, and
  driving the switches in the third set of switches (for instance, $S_{FIB}$, $S_{F1D}$, $S_{F2B}$, $S_{F2D}$) to couple said one of the first and second capacitances in the first feedback branch and said one of the third and fourth capacitances in the second feedback branch to the first (for instance, $V_{OUTp}$) and second (for instance, $V_{OUTn}$) output nodes ($V_{OUTn}$, $V_{OUTp}$) of the amplifier based on a second reset signal (for instance, RSTD) having a first value,
  switching (for instance, $t_2$) the first reset signal from the first value to a second value after elapse of a first time interval,
  in response to the first reset signal switching from the first value to the second value, maintaining the second reset signal at said first value for a further time interval (for instance, $T_{DELAY}$) exceeding the first time interval (for instance, P0, P1) during which the first reset signal has the first value.

As exemplified in FIG. 7C, after complete discharge, the input nodes $V_{IN1}$, $V_{IN2}$ can be coupled to the input square waveforms $V_0$, $V_0'$.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
an amplifier having a first input node and a second input node configured to be coupled to opposite ends of at least one capacitance to detect a capacitive variation signal indicative of variations in a capacitance value of the at least one capacitance, the amplifier having a first output node and a second output node,
a bias voltage node configured to provide a bias voltage level,
a first set of switches configured, based on a first reset signal having a first value, to couple the first and second input nodes of the amplifier to the bias voltage node and to couple therebetween the first and second output nodes of the amplifier,
a first feedback branch coupled between the first output node and the first input node of the amplifier, the first feedback branch including a first RC network including a first and a second capacitance,
a second feedback branch coupled between the second output node and the second input node of the amplifier, the second feedback branch including a second RC network including a third and a fourth capacitance,
the first and second feedback branches further including:
a second set of switches intermediate to the first and second input nodes of the amplifier and the first, second, third and fourth capacitances, and
a third set of switches intermediate to the first and second output nodes of the amplifier and the first, second, third and fourth capacitances,
wherein
the switches in the second set of switches are configured to selectively couple one of the first and second capacitances in the first feedback branch and one of the third and fourth capacitances in the second feedback branch to the first and second input nodes of the amplifier based on a second reset signal having a first value, and
the switches in the third set of switches are configured to selectively couple said one of the first and second capacitances in the first feedback branch and said one of the third and fourth capacitances in the second feedback branch to the first and second output nodes of the amplifier based on a second reset signal having a first value,
wherein the first reset signal is configured to have a first value for a first time interval and to switch from the first value to a second value after the first time interval, and wherein, in response to the first reset signal switching from the first value to the second value, the second reset signal maintains said first value for a further time interval exceeding the first time interval during which the first reset signal has the first value.

2. The circuit of claim 1, wherein:
the circuit includes a power supply of the amplifier, the power supply configured to be powered-down based on a power-down signal having a first value,
the first time interval during which the first reset signal is configured to have the first value includes a first sub-interval and a second sub-interval, and
the power-down signal has the first value during the first sub-interval and the second value during the second sub-interval, the power supply of the amplifier being powered-down during the first sub-interval as a result.

3. The circuit of claim 1, wherein:
the amplifier has a signal amplification bandwidth, and
the further time interval exceeding the time interval during which the first reset signal has the first value has a time duration that is a function of the signal amplification bandwidth of the amplifier.

4. The circuit of claim 1, wherein the amplifier is a fully differential operational trans-conductance amplifier (OTA).

5. The circuit of claim 1, wherein the second feedback branch is a replica of the first feedback branch.

6. The circuit of claim 1, wherein:
the first feedback branch includes a parallel connection of the first capacitance and the second capacitance, said parallel connection arranged in parallel to a resistance,
the second set of switches includes:
a first switch interposed between the first input node of the amplifier and the first capacitance,
a second switch interposed between the first input node of the amplifier and the second capacitance, and
the third set of switches includes:
a respective first switch interposed between the first output node of the amplifier and the first capacitance, and
a respective second switch interposed between the first output node of the amplifier and the second capacitance.

7. The circuit of claim 1, wherein:
the second feedback branch includes a parallel connection of the third capacitance and the fourth capacitance, said parallel connection arranged in parallel to a resistance,
the second set of switches includes:
a third switch interposed between the second input node of the amplifier and the third capacitance,
a fourth switch interposed between the second input node of the amplifier and the fourth capacitance, and
the third set of switches includes:
a respective third switch interposed the second output node of the output nodes of the amplifier and the first capacitance in the second feedback branch, and
a respective fourth switch interposed between the second output node of the amplifier and the second capacitance.

8. A sensor device, comprising:
at least one capacitance configured to transduce a variation of a physical quantity into a capacitive variation signal,
a reference capacitor coupled to the at least one capacitance, the reference capacitor having a value of capacitance substantially equal to a value of capacitance at rest of the at least one capacitance,
a circuit having input nodes coupled at ends of the at least one capacitance and at ends of the reference capacitor, the circuit including:
an amplifier having a first input node and a second input node coupled to the ends of the at least one capacitance to detect a capacitive variation signal indicative of variations in a capacitance value of the at least one capacitance, the amplifier having a first output node and a second output node,
a bias voltage node configured to provide a bias voltage level,
a first set of switches configured, based on a first reset signal having a first value, to couple the first and second input nodes of the amplifier to the bias voltage node and to couple therebetween the first and second output nodes of the amplifier, a first feedback branch coupled between the first output node and the first input node of the amplifier, the first feedback branch including a first RC network including a first and a second capacitance, a second feedback branch coupled between the second output node and the second input node of the amplifier, the second feedback branch including a second RC network including a third and a fourth capacitance, the first and second feedback branches further including:

a second set of switches intermediate to the first and second input nodes of the amplifier and the first, second, third and fourth capacitances, and a third set of switches intermediate to the first and second output nodes of the amplifier and the first, second, third and fourth capacitances, wherein the switches in the second set of switches are configured to selectively couple one of the first and second capacitances in the first feedback branch and one of the third and fourth capacitances in the second feedback branch to the first and second input nodes of the amplifier based on a second reset signal having a first value, and the switches in the third set of switches are configured to selectively couple said one of the first and second capacitances in the first feedback branch and said one of the third and fourth capacitances in the second feedback branch to the first and second output nodes of the amplifier based on a second reset signal having a first value; and control circuitry coupled to the circuit and configured to provide a first reset signal and a second reset signal thereto, wherein the first reset signal is configured to have a first value for a first time interval and to switch from the first value to a second value after the first time interval, and wherein, in response to the first reset signal switching from the first value to the second value, the second reset signal maintains said first value for a further time interval exceeding the first time interval during which the first reset signal has the first value.

9. The sensor of claim 8, comprising a further set of switches configured to couple an input node of the at least one capacitance and an input node of the reference capacitor to the bias voltage node based on the second reset signal having a first value.

10. The sensor of claim 8, wherein:
the circuit includes a power supply of the amplifier, the power supply configured to be powered-down based on a power-down signal having a first value,
the first time interval during which the first reset signal is configured to have the first value comprises a first sub-interval and a second sub-interval, and
the power-down signal has a first value during the first sub-interval and a second value during the second sub-interval, the power supply of the amplifier being powered-down during the first sub-interval as a result.

11. The sensor of claim 8, wherein:
the amplifier has a signal amplification bandwidth, and
the further time interval exceeding the time interval during which the first reset signal has the first value has a time duration that is a function of the signal amplification bandwidth of the amplifier.

12. The sensor of claim 8, wherein the amplifier is a fully differential operational trans-conductance amplifier (OTA).

13. The sensor of claim 8, wherein the second feedback branch is a replica of the first feedback branch.

14. The sensor of claim 8, wherein:
the first feedback branch includes a parallel connection of the first capacitance and the second capacitance, said parallel connection arranged in parallel to a resistance,
the second set of switches includes:
a first switch interposed between the first input node of the amplifier and the first capacitance,
a second switch interposed between the first input node of the amplifier and the second capacitance, and
the third set of switches includes:
a respective first switch interposed between the first output node of the amplifier and the first capacitance, and
a respective second switch interposed between the first output node of the amplifier and the second capacitance.

15. The sensor of claim 8, wherein:
the second feedback branch includes a parallel connection of the third capacitance and the fourth capacitance, said parallel connection arranged in parallel to a resistance,
the second set of switches includes:
a third switch interposed between the second input node of the amplifier and the third capacitance,
a fourth switch interposed between the second input node of the amplifier and the fourth capacitance, and
the third set of switches includes:
a respective third switch interposed the second output node of the output nodes of the amplifier and the first capacitance in the second feedback branch, and
a respective fourth switch interposed between the second output node of the amplifier and the second capacitance.

16. A method of operating a circuit according to claim 1, the method comprising:
providing a bias voltage node configured to provide a bias voltage level;
driving the first set of switches, based on a first reset signal, to couple the input nodes of an amplifier circuit to the bias voltage node and to couple the first and second output nodes of the amplifier circuit therebetween;
driving switches in the second set of switches to selectively couple one of the first and second capacitances in the first feedback branch and one of the third and fourth capacitances in the second feedback branch to the first and second input nodes of the amplifier circuit based on a second reset signal having a first value;
driving the switches in the third set of switches to selectively couple said one of the first and second capacitances in the first feedback branch and said one of the third and fourth capacitances in the second feedback branch to the first and second output nodes of the amplifier circuit based on a second reset signal having a first value;
switching the first reset signal from the first value to a second value after elapse of a first time interval; and
in response to the first reset signal switching from the first value to the second value, maintaining the second reset signal at said first value for a further time interval exceeding the first time interval during which the first reset signal has the first value.

17. The method of claim 16, further comprising:
providing a power-down signal having the first value during a first sub-interval of the first time interval;
providing the power-down signal having the second value during a second sub-interval of the first time interval; and
powering down a power supply of the amplifier circuit during the first sub-interval based on the power-down signal.

18. The method of claim 16, wherein the further time interval has a duration that is a function of a signal amplification bandwidth of the amplifier circuit.

19. The method of claim 16, wherein the amplifier circuit is a fully differential operational trans-conductance amplifier (OTA).

20. The method of claim 16, wherein the second feedback branch is a replica of the first feedback branch.

* * * * *